(12) United States Patent
Wada et al.

(10) Patent No.: US 6,593,252 B1
(45) Date of Patent: Jul. 15, 2003

(54) FILM DEPOSITION METHOD AND APPARATUS

(75) Inventors: Yuichi Wada, Narita (JP); Hiroyuki Yarita, Narita (JP); Hisashi Aida, Narita (JP); Naomi Yoshida, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,609

(22) PCT Filed: Oct. 29, 1999

(86) PCT No.: PCT/JP99/06033

§ 371 (c)(1),
(2), (4) Date: Apr. 30, 2001

(30) Foreign Application Priority Data

Oct. 29, 1998 (JP) ............................................. 10-308661

(51) Int. Cl.$^7$ ............................................. H01L 21/469
(52) U.S. Cl. ..................... 438/781; 438/761; 438/781
(58) Field of Search ................... 438/758, 761, 438/781; 118/725, 726

(56) References Cited

U.S. PATENT DOCUMENTS

| 5,462,014 | A | * | 10/1995 | Awaya et al. | 118/725 |
| 6,004,885 | A | * | 12/1999 | Hayakawa et al. | 438/758 |
| 6,165,555 | A | * | 12/2000 | Jun et al. | 427/252 |
| 6,326,090 | B1 | * | 12/2001 | Schultz et al. | 428/688 |

FOREIGN PATENT DOCUMENTS

| JP | 63-182074 | 7/1988 |
| JP | 2-237680 | 9/1990 |
| JP | 4-53132 | 2/1992 |
| JP | 7-68219 | 3/1995 |
| JP | 7-213970 | 8/1995 |
| JP | 7-267621 | 10/1995 |
| JP | 9-45773 | 2/1997 |
| JP | 9-302471 | 11/1997 |
| JP | 10-85641 | 4/1998 |
| JP | 11-1778 | 1/1999 |

* cited by examiner

Primary Examiner—David Nelms
Assistant Examiner—Dao H. Nguyen
(74) Attorney, Agent, or Firm—Moser, Patterson & Sheridan, LLP

(57) ABSTRACT

The present invention is characterized by comprising a supply means (28) for supplying an organometallic fluid, which has an organic metal as a main component and which precipitates film deposition material using a pyrolytic decomposition reaction; an application means (126) for applying the organometallic fluid that is supplied by said supply means onto a to-be-processed body; and a heating means (52) for heating to a predetermined temperature the to-be-processed body to which is applied the organometallic fluid by said application means; wherein said application means (126) is characterized by being outfitted with an application fluid containing body (100), which is capable of containing said organometallic fluid and capable of coming into contact with and separation from said to-be-processed body.

8 Claims, 3 Drawing Sheets

FILM DEPOSITION METHOD AND APPARATUS

TECHNICAL FIELD

The present invention relates to fabrication processing techniques of semiconductor devices and related devices. In particular, it relates to techniques for performing film deposition using fluids that have an organic metal as the main component (organometallic fluids).

BACKGROUND ART

In recent years, as improvements in the integration and miniaturization of the semiconductor device progresses, there has been a steady shift from the present sub-half-micron range to the sub-quarter-micron range. In this quest to develop the next generation of semiconductor devices, film deposition techniques are exceedingly important.

In response to demands for improvements in integration and further miniaturization, switching from aluminum-based materials to copper-based materials being used as interconnect material or line material is under consideration. Presently, metal-organic chemical vapor deposition (MOCVD), which is performed by vaporizing an organic metal (usually fluid at room temperature and under normal pressure), for example (hfac)$Cu^{+1}$(tmvs), introducing it to the process chamber, and depositing a film by causing a pyrolytic decomposition reaction to occur on the wafer being held in said process chamber, is put into affect.

DISCLOSURE OF THE INVENTION

Such conventional MOCVD processes provide superb step coverage and are extremely effective in the fabrication of very thin films. However, with these MOCVD processes, problems developed such as the effective usage of the organic metal being extremely poor due to the organic metal vaporized inside the chamber being released out of the chamber driven by the release pump. Furthermore, in regards to the organic metal not released outside the process chamber, problems also developed where film could not be formed in the desired locations on the to-be-processed body because it was in its gas state. In particular, in cases such as those mentioned above where high cost materials such as (hfac)$Cu^{+1}$(tmvs) are used, when the organic metal is used with low effectiveness, there is a large increase in costs.

The present invention takes the above information into consideration and aims to provide a film deposition process and apparatus, which use organometallic fluids, wherewith the organic metal may be used with high effectiveness, and which may accurately apply organometallic fluid onto the to-be-processed body.

In order to achieve the above objectives, the inventors discovered that it is possible to cause a pyrolytic decomposition reaction using heat even when the organometallic fluid is in its fluid state. In other words, film deposition is possible even if the organometallic fluid is not vaporized, and the present invention was first formulated based on these findings.

Here, it is possible to consider applying the organometallic fluid while heating the wafer; however in this situation, the possibility of the organometallic fluid vaporizing increases making it difficult to use the organic metal more effectively, and it is difficult to obtain an accurate application of organometallic fluid onto the to-be-processed body.

Therefore a film deposition method, according to the present invention, is characterized by comprising: a first step of preparing an organometallic fluid that has organic metal as a main component, which precipitates a film deposition material using a pyrolytic decomposition reaction; a second step of applying said organometallic fluid onto a to-be-processed body by bringing a fluid containing body, which contains said organometallic fluid, into contact with said to-be-processed body at a temperature within the non-reactive range of said organic metal; and a third step of heating said to-be-processed body to a predetermined temperature, and causing the pyrolytic decomposition reaction of said organic metal in said organometallic fluid that is applied onto said to-be-processed body to occur so as to form a film on said to-be-processed body.

With this method, after the organometallic fluid has been applied to the to-be-processed body at a temperature within the non-reactive range of the organic metal, a film may be formed on the to-be-processed body by heating the to-be-processed body to a predetermined temperature. In particular, with this invention, since the organometallic fluid is applied onto the to-be-processed body at a temperature within the non-reactive range of the organic metal, the organometallic fluid does not vaporize. Besides, since the application of organometallic fluid onto said to-be-processed body is performed by bringing an application fluid containing body into contact with said to-be-processed body, no organometallic fluid is wasted, and together with being able to use the organic metal more effectively, application of the organometallic fluid onto the to-be-processed body can be performed with accuracy.

It is noted here that the organometallic fluid may comprise solely an organic metal, or it may comprise a mixture of an organic metal and a solvent. It is also noted that in this specification, 'mixed fluid' may refer to cases where the organic metal is completely dissolved or it may refer to cases where part of it is suspended. Furthermore, 'application fluid containing body' may mean a sponge, a brush, or the like that absorbs, the organometallic fluid, or something with a surface to which the organometallic fluid may be applied.

Furthermore, when the to-be-processed body is a wafer, it is preferable that during application of the organometallic fluid onto said wafer, the outer rim of the wafer be covered by a mask. In this case, unnecessary application of organometallic fluid onto the outer rim of the wafer may be prevented.

Furthermore, it is preferable that the film deposition apparatus for executing the above method comprises a supply means for supplying an organometallic fluid, which has an organic metal as a main component and which precipitates film deposition material using a pyrolytic decomposition reaction; an application means for applying the organometallic fluid that is supplied by said supply means onto a to-be-processed body; and a heating means for heating to a predetermined temperature the to-be-processed body to which is applied the organometallic fluid by said application means; wherein said application means is outfitted with a fluid containing body, which is capable of containing said organometallic fluid and capable of coming into contact with and separation from said to-be-processed body.

BEST MODE FOR CARRYING OUT THE INVENTION

Figure 1:
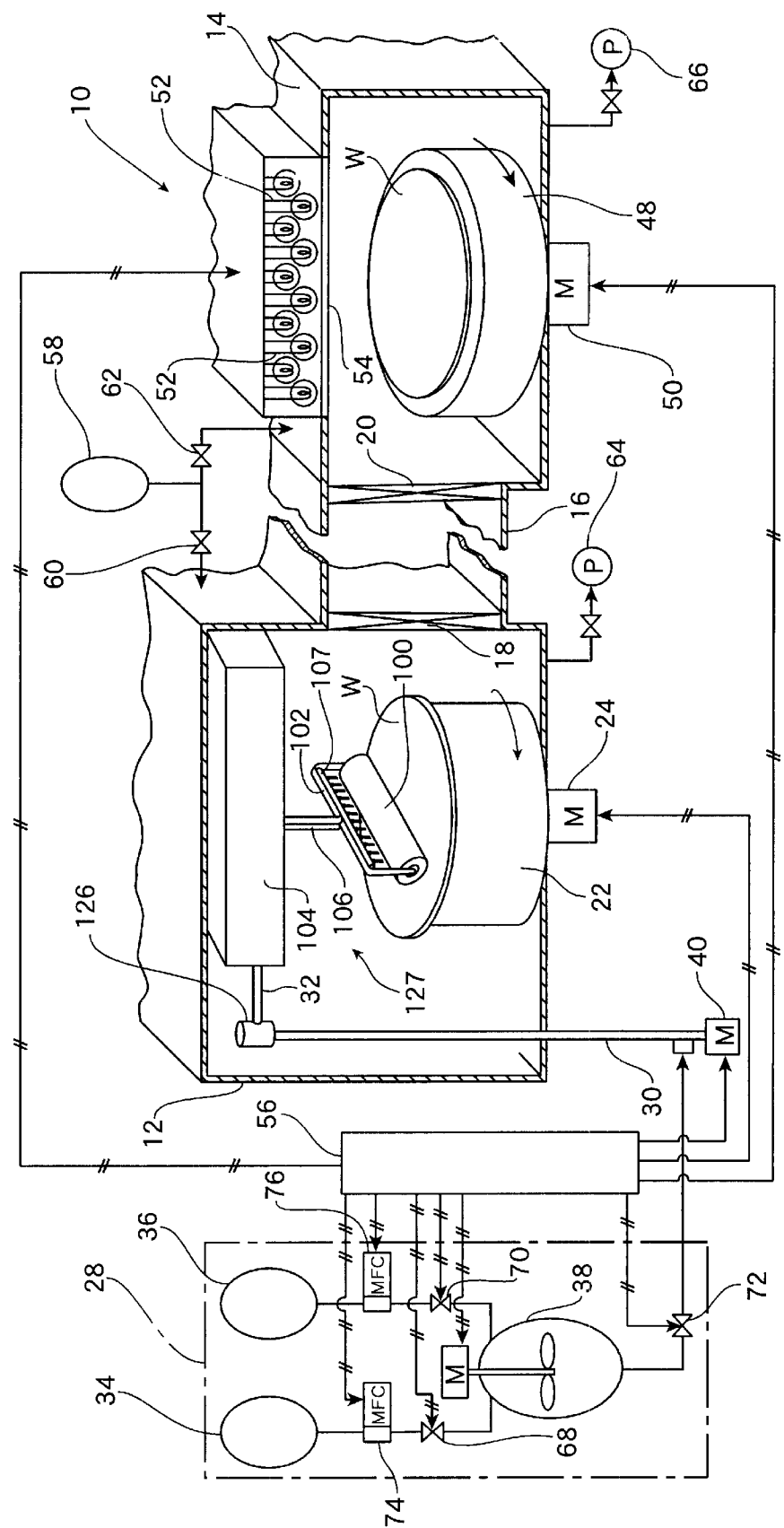
FIG. 1 is a schematic explanatory diagram showing the preferred embodiment of the film deposition apparatus according to the present invention.

In the following, the preferred embodiments according to the present invention will be described in detail while referencing the Figures. It is noted here that throughout all of the drawings, the same or corresponding parts are labeled with the same respective reference numerals and repetitive descriptions are omitted. Furthermore, in the following embodiments, the case of using (hfac)Cu$^{+1}$(tmvs), which is a copper-ketonato metal complex of organic metals, as the film base material, and forming a thin film of copper on the surface of the semiconductor wafer is assumed. The constitutional formula of (hfac)Cu$^{+1}$(tmvs) is shown in FIG. 1, and it is in its fluid state in an environment of normal pressure at room temperature. In addition, the viscosity of (hfac)Cu$^{+1}$(tmvs) is low, and although it can be applicable for use as it is in the present invention to be described below, in the following embodiments, it is mixed with an organic solvent such as the aliphatic saturated hydrocarbon heptadecane to allow for easier handling. In the following, the organometallic fluid containing this(hfac)Cu$^{+1}$(tmvs) is referred to as 'film deposition fluid'.

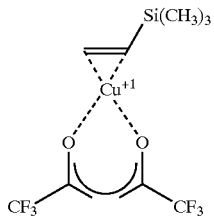

FIG. 1 shows the first embodiment of the film deposition apparatus according to the present invention. Film deposition apparatus 10 shown in the same Figure comprises first process chamber 12, in which is performed processing that applies film deposition fluid onto the object to be processed, that is, the semiconductor wafer W; and second process chamber 14, in which is performed processing that pyrolytically decomposes the organic metal, or in other words, the (hfac)Cu$^{+1}$(tmvs) on wafer W.

First process chamber 12 and second process chamber 14 are connected through transfer chamber 16, which is located between them, and wafer W can be transferred between process chambers 12 and 14 using an appropriate carrying means (not shown in the Figure). In the Figure, reference numerals 18 and 20 refer to the slit valves that open and close the sections between transfer chamber 16 and process chambers 12 and 14, respectively.

Turntable (support means) 22 is configured inside first process chamber 12 to support semiconductor wafer W. Wafer W is mounted horizontally on the upper surface of this turntable 22, and is held in place with an appropriate holding means such as a vacuum chuck (not shown in the Figures). In the Figure, turntable 22 has a diameter that is smaller than the diameter of wafer W; however, in cases where the diameter of turntable 22 is larger than wafer W, not only does film deposition fluid adhere to wafer W, but also to the exposed portions of turntable 22, which can have negative repercussions for the next wafer W to be processed. In addition, turntable 22 is structured so that it may be rotated at relatively high speeds using drive motor 24, which is configured external to first process chamber 12.

In first process chamber 12, application device (application means) 126 is further provided for applying film deposition fluid onto the surface of wafer W. Application device 126 comprises supply pipeline 30, which introduces film deposition fluid from film deposition fluid supply system (supply means) 28 configured external to first process chamber 12; pipeline 32, which extends horizontally from the upper terminal of this supply pipeline 30; and film deposition application unit 127. The main components of supply system 28 are (hfac)Cu$^{+1}$(tmvs) supply source 34; heptadecane supply source 36; and mixing device 38, which mixes the fluids from supply sources 34 and 36 to form the film deposition fluid.

Figure 2:
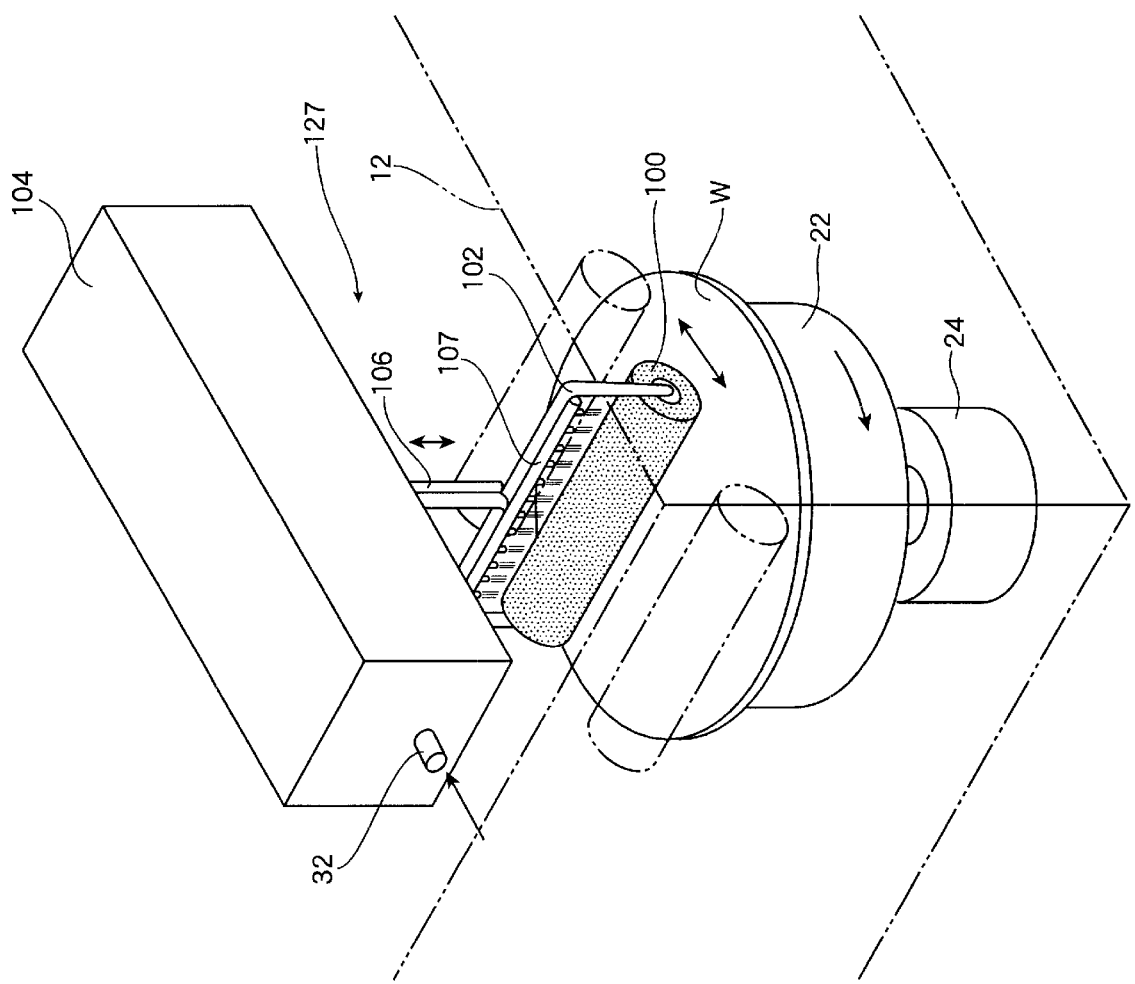
FIG. 2 is an enlarged oblique perspective view showing an application unit of the film deposition apparatus in FIG. 1.

FIG. 2 is an enlarged oblique perspective view of film deposition application unit 127. This application unit 127 comprises a sponge-like roller pad (a body containing fluid to be applied) 100, which is configured above turntable 22. Roller pad 100 is supported by support member 102 in a manner such that both ends are capable of being rotated about its rotational axis, which is horizontal. This support member 102 is capable of being moved up and down by drive device 104, which is provided on the ceiling of process chamber 12, in order to bring it into contact/separation with/from wafer W, which is supported by turntable 22. In addition, support member 102 is also capable of being moved back and forth horizontally.

Sputtering pipe 106, which sputters out film deposition fluid in order to wet roller pad 100, is also attached to supporting member 102. The end of this sputtering pipe 106 is situated above roller pad 100, and parallel extension portion 107, along which are configured a plurality of sputtering outlets, is extended parallel to roller pad 100, running along almost its entire length. Consequently, when film deposition fluid is poured through the sputtering outlets of sputtering pipes 106 and 107 from the supply system, roller pad 100 becomes fairly evenly wet with film deposition fluid.

Likewise, as shown in FIG. 1, turntable (support means) 48 is configured in second process chamber 14 to support wafer W in a manner such that it can be rotated. This turntable 48 has basically the same mechanism as turntable 22 in first process chamber 12, whereby it is rotated by drive motor 50 and can hold wafer W in place using an applicable means such as a vacuum chuck. However, turntable 48 rotates at a slower speed than turntable 22 in first process chamber 12. In addition, the diameter of turntable 48 is made larger than the diameter of wafer W. There are various reasons for this difference, including the fact that since a pyrolytic decomposition reaction of the organic metal on the surface of wafer W occurs in second process chamber 12, this difference allows the these reactions to occur more uniformly.

Above turntable 48, a plurality of heating lamps 52, which may be for example halogen lamps, are configured behind silica glass plate 54. This configuration allows the surface of wafer W that is supported on turntable 48 to be heated. Temperature control is achieved based on the output signals from temperature gages (not shown in the Figure) such as a thermoelectric couple attached to turntable 48 or a pyrometer configured on the ceiling of process chamber 14, and is performed by regulating device 56, which comprises for example a microcomputer, that turns on and off, or regulates the amount of power input to heating lamps 52.

It is noted here that in FIG. 1, reference marker 58 refers to supply source 58 of an inert gas such as nitrogen gas, and is configured to supply the inert gas to first process chamber 12 and second process chamber 14, respectively. On each of the pipelines from inert gas supply source 58 there are configured respective flow regulating valves 60 and 62. In addition, reference numbers 64 and 66 refer to exhaust pumps, which are used to evacuate the atmosphere inside process chambers 12 and 14, respectively. These exhaust pumps 64 and 66, together with flow regulating valves 60 and 62, are regulated by regulating device 56 described in the previous paragraph. Regulating device 56, in the first embodiment, further regulates drive motors 24 and 50 of turntables 22 and 48; swinging actuator 40 of nozzle 32; open/close valves 68, 70, and 72, and mixing device 38 in fluid deposition fluid supply system 28; and mass flow rate regulating devices 74 and 76.

Next, the procedure will be described for performing copper film deposition using film deposition apparatus 10 with the structure described in the previous paragraph. It is noted here that, while not specifically stated, the following procedure is automatically performed under the management of regulating device 56.

To begin with, wafer W is carried into first process chamber 12 and wafer W is placed at a predetermined position on the upper surface of turntable 22 and locked in. At this point, in order to prevent oxidization of the surface of wafer W or other reactions from happening, it is preferable that an inert gas such as nitrogen gas be supplied from inert gas supply source 58 while driving exhaust pump 64, to form an inert gas atmosphere inside of first process chamber 12.

Next, as film deposition fluid is being sputtered out continuously or intermittently from deposition fluid supply system 28 through sputtering pipes 106 and 107 towards roller pad 100, drive device 104 is controlled to lower roller pad 100 and bring it into contact with wafer W, which is then rolled back and forth over the surface of wafer W. While this is occurring, if turntable 22 is to rotated at a relatively slow speed and film deposition fluid is applied onto the portion that is in contact with roller pad 100, the rotation of turntable 22 and the back and forth movement of roller pad 100 is appropriately adjusted so that film deposition fluid may be applied uniformly onto the entire surface of wafer W. In this case, since only those portions that come into contact with roller pad 100 are applied film deposition fluid, thus there is little film deposition fluid wasted, the amount of fluid spillage is greatly controlled, and film deposition fluid is applied across the entire surface of wafer W with a uniform film thickness and quality. As a result, together with improving the effective use of the organic metal, the application of film deposition fluid onto the wafer W can be performed more assuredly. In particular, since (hfac)Cu$^{+1}$(tmvs), which is used as the film deposition fluid in the present embodiment, is a high cost base material, if this material is used more effectively then a large reduction in costs can be measured.

When the pressure inside first process chamber 12 is set higher than normal air pressure, coverage is improved by the effects of the air pressure forcing it in; in cases where filling-in processing is being performed, holes such as contact holes and trenches formed in the surface of wafer W can be filled in with greater accuracy so that the development of problems such as vacancies can be avoided. Moreover, the temperature inside first process chamber 12 should be the temperature of the organic metal (hfac)Cu$^{+1}$(tmvs) in its non-reactive range, and preferably at normal room temperature.

Much of the film deposition fluid supplied onto wafer W splatters off from the edge of wafer W due to the centrifugal force. As a result, the film deposition fluid does not travel around onto the exposed portion of the underside of wafer W to prevent film from being deposited on the underside of the wafer. If a film is formed on the underside of wafer W, there may be harmful effects such as peeling and particlization.

Once the application procedure has ended, the supply of film deposition fluid is terminated, and while roller pad 100 is raised back up and returned to its original position, the rotation of turntable 22 is stopped.

Next, slit valves 18 and 20 are temporarily opened up and using a carrying means not shown in the Figure, wafer W is moved from first process chamber 12 to second process chamber 14 through transfer chamber 16, placed on turntable 48 in a predetermined position, and locked into place. The air inside second process chamber 14 has already been replaced by an inert gas atmosphere during the application procedure described in the preceding paragraphs, and the pressure inside is set higher than normal air pressure. It is noted here that by also replacing the inside transfer chamber 16 with an inert gas atmosphere, it is possible to perform an entire processing series without exposing wafer W to the outside air, thereby preventing harmful effects such as natural oxidation.

Once wafer W has been placed in the predetermined position, drive motor 50 is activated causing turntable 48 to rotate while also controlling heating lamps 52 to increase the temperature of surface of wafer W to a predetermined temperature, for example between 150° C. and 200° C. As a result, the (hfac)Cu$^{+1}$(tmvs) contained in the film deposition fluid coating the surface of wafer W is reacted by pyrolytic decomposition, which yields the precipitation of a copper film on the surface of wafer W. The pyrolytic decomposition reaction of (hfac)Cu$^{+1}$(tmvs) is as shown below.

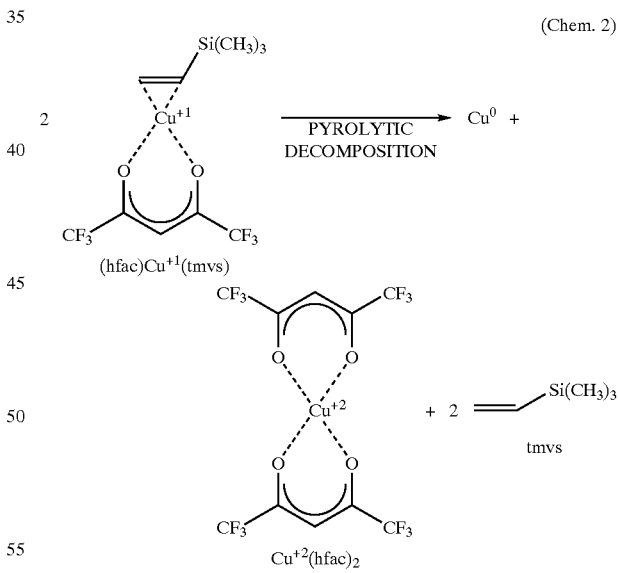

(Chem. 2)

During this reaction, the Cu$^{+2}$(hfac)$_2$ and tmvs that are formed are released out of second process chamber 14 by exhaust pump 66 because they change into their respective gas state because of the temperature inside second process chamber 14 during the pyrolytic decomposition reaction. Also due to the heat, the organic solvent heptadecane is also evaporated off of wafer W and released without leaving a trace.

As described above, the uniform thickness and quality of the layer of film deposition fluid throughout the entire surface of wafer W allows the copper film being formed to have uniform film thickness and quality as well. Also, the fact that turntable 48 is rotated allows the unequal distribution of temperature resulting from the positioning of heating lamps 52 to be prevented, and in addition, allows the heat dissipation throughout wafer W to become fairly uniform as a result of the entire underside of wafer W being in contact with turntable 48. Accordingly, the pyrolytic decomposition reaction can be carried out uniformly throughout the entire wafer surface, further contributing to improved uniformity of layer thickness and quality. Moreover, in this embodiment, the pressure inside second process chamber 14 is higher than normal air pressure, which also increases the boiling point of the film deposition fluid, however, as a result, natural evaporation from the surface of the film deposition fluid during the pyrolytic decomposition reaction is inhibited, thus yielding a stable pyrolytic decomposition reaction. Once the pyrolytic decomposition reaction has ended, wafer W is transported out of second process chamber 14 and the film deposition process is completed.

In this manner, by separating the application procedure and the pyrolytic decomposition reaction procedure, a superb copper thin film may be obtained having uniform film thickness and quality; moreover, since the application of film deposition fluid onto wafer W is performed by bringing roller pad 100 containing film deposition fluid into contact with wafer W, without any film deposition fluid wasted, therefore, the organic metal may be used more effectively, and the application of film deposition fluid onto the wafer W may be performed more assuredly.

The preferred embodiment of the present invention is described in detail above; however, various alternatives and modifications may be made without deviating from the scope of the present invention.

Figure 3:
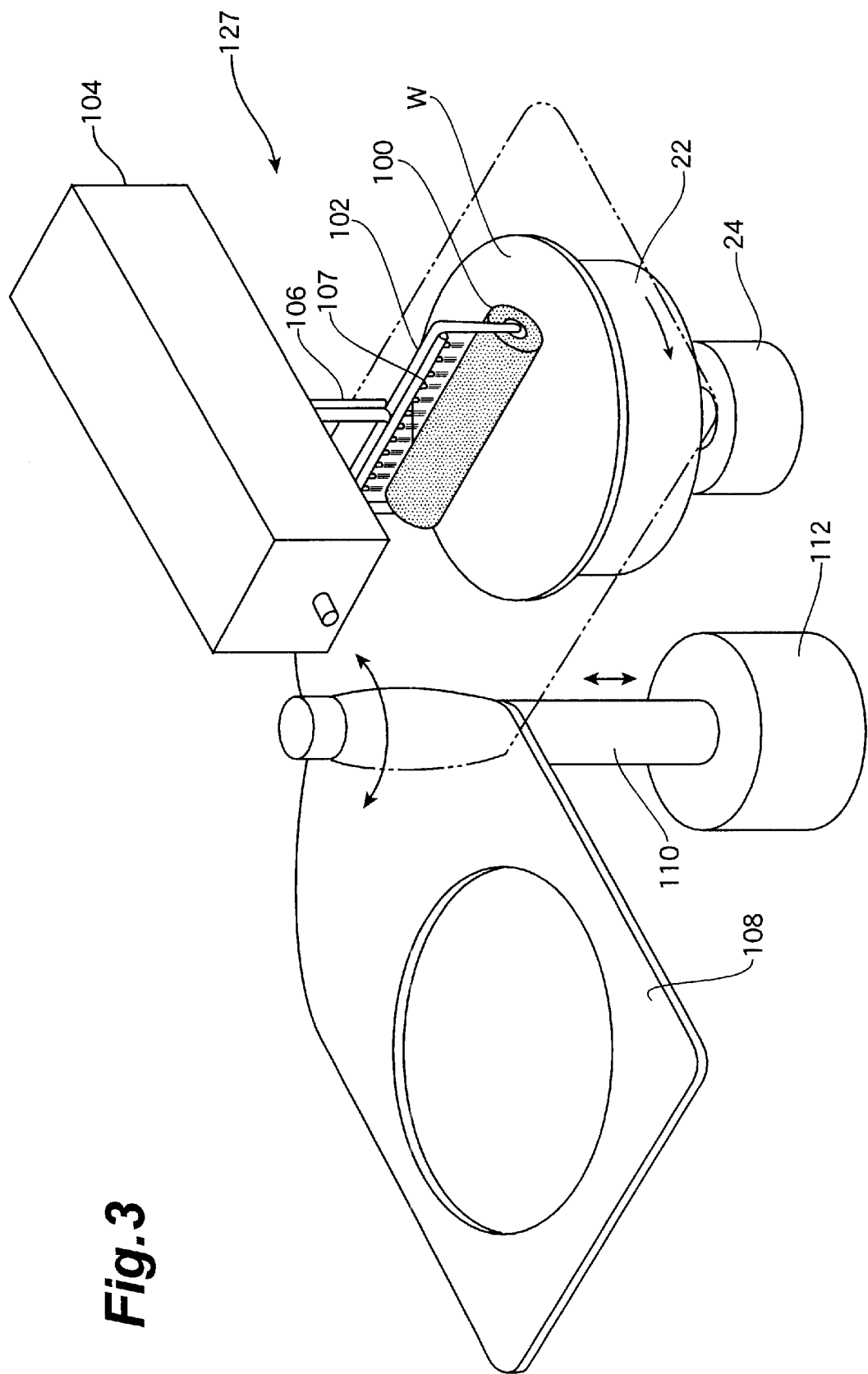
FIG. 3 is an oblique perspective view showing an alternative example of the application unit in FIG. 2.

FIG. 3 is a diagram that illustrates an alternative form of application unit 127 of application device 126 that is shown in FIGS. 1 and 2. The application unit 127 of FIG. 3 differs from the device shown in FIGS. 1 and 2 in that it is further outfitted with mask 108, which prevents application to the outer rim (beveled portion) of wafer W. This mask 108 is supported by support shaft 110 inside first process chamber 12. Support shaft 110 is capable of being rotated and moved up and down. Accordingly, by controlling the drive device 112 of support shaft 110, mask 108 can be swung to place it above wafer W on turntable 22, and then lowered so that it touches the outer rim of wafer W, effectively masking said portions. Since roller pad 100 does not come into contact with the portions covered by mask 108, application to those portions is prevented. As a result, the organic metal may be used more effectively. Needless to say, the mechanism for moving mask 106 is not limited to that shown in the Figure.

In this type of application device 126, the same results are obtained if, instead of roller pad 100, a supple brush is used. Also, the CMP device (not shown in the Figures) that uses the CMP process mentioned above is a device that soaks the pad of its platen with a polishing slurry, brings the platen into contact with the surface of the wafer, and moves them relative to each other, however, if instead of slurry the pad of its platen is supplied with film deposition fluid, it is possible to use as a roller application device a chemical metal polishing device. In current semiconductor manufacturing facilities, where multi-stage processing with a plurality of CMP devices is widely used, one of the stages may be effectively used as an application device.

On the other hand, the heating means used for the pyrolytic decomposition reaction in second chamber 14 is also not limited to heating lamps 52. For example, a resistance heater, an induction-heating device, or an oil heater may be integrated into the turntable that acts as a wafer support means or into the susceptor.

In the above, the preferred embodiments of the present invention are described in detail; however, it is considered that the present invention is not limited to the various examples mentioned above. For example, in the above examples, film deposition fluid is fluid containing a mixture of a copper-ketonato metal complex such as $(hfac)Cu^{+1}$(tmvs) and an aliphatic saturated hydrocarbon such as heptadecane; however, it is also feasible to have the organic metal be another copper-ketonato metal complex such as $(hfac)Cu^{+1}$(teovs), or any other organic metal other than the copper-ketonato metal complex. In addition, as the organic solvent for the copper-ketonato metal complex, another aliphatic saturated hydrocarbon such as pentadecane, hexadecane, or octadecane may be used, and as the solvent for the organic metals besides the copper-ketonato metal complex, any other solvent may be used. Furthermore, the film deposition fluid may include only the organic metal.

Industrial Applicability

As described above, according to the present invention, since the organometallic fluid is applied onto the body to be processed at a temperature within the non-reactive range of the organic metal, the organometallic fluid does not change into its vapor state. Also, since the application of the organometallic fluid to the to-be-processed body is performed by bringing the to-be-processed body into contact with an application fluid, there is no wasted organometallic fluid, and together with allowing the organic metal to be used more effectively, the organometallic fluid may be surely applied to the to-be-processed body.

What is claimed is:

1. A processing system, comprising:
   a fluid supply supplying an organometallic fluid;
   a first vacuum chamber, comprising:
      a first wafer support member; and
      a fluid applicator in fluid communication with the fluid supply and comprising an organometallic fluid-bearing wafer contact surface for contacting a wafer disposed on the first wafer support member and applying the organometallic fluid onto the wafer while maintaining the wafer at a non-reactive temperature of the organometallic fluid; and
   a second vacuum chamber, the second vacuum chamber comprising:
      a second wafer support member; and
      a heating device for heating the wafer to a predetermined reactive temperature of the organometallic fluid while disposed on the second wafer support member.

2. The processing system of claim 1, wherein the first and second vacuum chambers are in selective communication via a wafer transfer passageway.

3. The processing system of claim 1, wherein the fluid applicator is a roller pad.

4. The processing system of claim 1, further comprising a wafer mask adapted to cover a periphery of the wafer.

5. The processing system of claim 1, wherein at least one of the first or second wafer support members are rotatable while having the wafer disposed thereon.

6. The processing system of claim 1, wherein the heating device comprises at least one heating lamp.

7. The processing system of claim 1, wherein a diameter of the first wafer support member is smaller than a diameter of the wafer.

8. The processing system of claim 7, wherein a diameter of the second wafer support member is greater than a diameter of the wafer.

* * * * *